(12) United States Patent  
Chen et al.

(10) Patent No.: US 9,117,943 B2  
(45) Date of Patent: Aug. 25, 2015

(54) SEMICONDUCTOR PACKAGE WITH THROUGH SILICON VIAS

(71) Applicant: TSMC Solid State Lighting Ltd., Hsinchu (TW)

(72) Inventors: Ding-Yuan Chen, Taichung (TW); Chen-Hua Yu, Hsinchu (TW); Wen-Chih Chiou, Zhunan Township (TW)

(73) Assignee: TSMC SOLID STATE LIGHTING LTD., Hsinchu (TW)

( * ) Notice: Subject to any disclaimer, the term of this patent is extended or adjusted under 35 U.S.C. 154(b) by 0 days.

(21) Appl. No.: 14/466,172

(22) Filed: Aug. 22, 2014

(65) Prior Publication Data

US 2014/0363910 A1 Dec. 11, 2014

Related U.S. Application Data

(62) Division of application No. 12/541,787, filed on Aug. 14, 2009, now Pat. No. 8,815,618.

(60) Provisional application No. 61/093,133, filed on Aug. 29, 2008.

(51) Int. Cl.
*H01L 33/00* (2010.01)
*H01L 21/78* (2006.01)
*H01S 5/12* (2006.01)
*H01S 5/227* (2006.01)

(52) U.S. Cl.
CPC .......... *H01L 33/0062* (2013.01); *H01L 21/78* (2013.01); *H01L 33/0066* (2013.01); *H01L 33/0079* (2013.01); *H01L 2924/01078* (2013.01); *H01S 5/1231* (2013.01); *H01S 5/2275* (2013.01)

(58) Field of Classification Search
CPC ............... H01L 33/0079; H01L 21/78; H01L 2924/01078; H01L 33/0066; H01L 33/0062; H01L 33/007; H01L 33/06; H01L 33/32; H01S 5/021; H01S 5/34333; H01S 5/22; H01S 5/1231; H01S 5/2275
USPC .................. 438/33, 22, 462; 257/97, 98, 100, 257/E33.055
See application file for complete search history.

(56) References Cited

U.S. PATENT DOCUMENTS

| 5,421,958 | A | | 6/1995 | Fathauer et al. |
| 5,439,843 | A | | 8/1995 | Sakaguchi et al. |
| 5,786,606 | A | * | 7/1998 | Nishio et al. .................. 257/103 |
| 6,194,239 | B1 | * | 2/2001 | Tayanaka ........................ 438/28 |

(Continued)

OTHER PUBLICATIONS

Celler, G.K. et al. "Frontiers of Silicon-on-Insulator" Journal of Applied Physics, vol. 93, No. 9, May 1, 2003, pp. 4955-4978.

(Continued)

*Primary Examiner* — Thinh T Nguyen
(74) *Attorney, Agent, or Firm* — Muncy, Geissler, Olds & Lowe, P.C.

(57) ABSTRACT

A method of forming a light-emitting diode (LED) device is provided. The method includes steps of providing a first substrate, forming an LED structure on the first substrate, forming a porous layer on the first substrate after forming the LED structure, forming a conductive substrate on the LED structure, and separating the LED structure from the first substrate along the porous layer. The substrate has a doped layer. The forming of the porous layer includes a step of converting the dopes layer to the porous layer.

20 Claims, 6 Drawing Sheets

(56) References Cited

U.S. PATENT DOCUMENTS

| | | | |
|---|---|---|---|
| 6,225,192 | B1 | 5/2001 | Aspar et al. |
| 6,426,512 | B1 | 7/2002 | Ito et al. |
| 6,466,631 | B1 | 10/2002 | Schenk |
| 6,794,684 | B2 | 9/2004 | Slater, Jr. et al. |
| 7,491,565 | B2 | 2/2009 | Coman et al. |
| 7,538,010 | B2 | 5/2009 | Faure et al. |
| 7,633,097 | B2 * | 12/2009 | Kim et al. .................. 257/200 |
| 7,719,099 | B2 * | 5/2010 | Tseng et al. ................ 257/690 |
| 2005/0280155 | A1 | 12/2005 | Lee |
| 2006/0121702 | A1 * | 6/2006 | Coman et al. ............... 438/483 |

OTHER PUBLICATIONS

Chen, N.C. et al. "Nitride Light-Emitting Diodes Grown in Si (111) Using a TiN Template" Applied Physics Letters, 88, 1911110, 2006, pp. 1-3.

Sakaguchi, K. et al. "Extremely High Selective Etching of Porous Si for Single Etch-Stop Bond-and-Etch-Back Silion-on-Insulator" Jpn. J. Appl. Phys., vol. 34, Feb. 1995, pp. 842-847.

Vincent, G. "Optical Properties of Porous Silicon Superlattices" Applied Physics Letters, 64 (18), May 2, 1994, pp. 2367-2369.

Yonehara, T. et al. "ELTRAN®; Novel SOI Wafer Technology" JSAP International, No. 4, Jul. 2001, pp. 10-16.

\* cited by examiner

SEMICONDUCTOR PACKAGE WITH THROUGH SILICON VIAS

PRIORITY DATA

The present application is a divisional application of U.S. patent application Ser. No. 12/541,787, filed on Aug. 14, 2009, now U.S. Pat. No. 8,815,618 issued Aug. 26, 2014, which claims the priority of U.S. Provisional application No. 61/093,133, entitled "Light-Emitting Diode on a Conductive Substrate," filed on Aug. 29, 2008, the disclosures of which are hereby incorporated by reference in its entirety.

TECHNICAL FIELD

This invention relates generally to semiconductor device manufacturing processes, and more particularly to forming crystalline group-III/V films on conductive substrates.

BACKGROUND

Light-emitting diodes (LEDs) are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as GaAs or GaN, the recombination of the electron-hole pairs injected into the depletion region causes the emission of electromagnetic radiation. By using materials with different band gaps, which emit electromagnetic radiation of different wavelengths, it is possible to create different color LEDs. The electromagnetic radiation may be in the visible range or may be in a non-visible range. Further, an LED with electromagnetic radiation emitting in a non-visible range may direct the non-visible light towards a phosphor lens or a like material type. When the non-visible light is absorbed by the phosphor, the phosphor emits a visible light.

It is desirable to use silicon substrates to form LED devices due in part to the low cost of the silicon substrates and the abundance of well-known processing techniques available for processing the silicon substrates. For vertical LED devices, the silicon substrates are used as a conductive interface to provide an electrical connection to the bottom contact layer of the LED structure. The silicon substrates, however, typically exhibit a relatively high light absorption rate, thereby negatively impacting the light efficiency of the LED device.

One method of addressing the problem of silicon substrate absorption is to use a reflective layer, such as a distributed Bragg reflector or a reflective buffer layer, to reflect some of the light away from the substrate to a light-emitting face. The reflective layer, however, may result in a poor crystal quality of the epitaxially grown group III-V layers.

Another method of addressing the problem is to remove the silicon substrate on which the III-V films forming the LED were grown, and then add a new conductive substrate. Problems associated with this method include the sacrifice of the entire silicon substrate, and the time and expense required to remove the silicon substrate.

Accordingly, there is a need for improved methods of fabricating LED devices with increased light efficiency.

SUMMARY OF INVENTION

These and other problems are generally reduced, solved or circumvented, and technical advantages are generally achieved, by embodiments of the present invention, which provides light-emitting diodes (LEDs).

A method of forming a light-emitting diode (LED) device is disclosed. The method includes steps of providing a first substrate, forming an LED structure on the first substrate, forming a porous layer on the first substrate after forming the LED structure, forming a conductive substrate on the LED structure, and separating the LED structure from the first substrate along the porous layer. The substrate has a doped layer. The forming of the porous layer includes a step of converting the dopes layed to the porous layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE EXEMPLARY EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming light-emitting diodes (LEDs) and the resulting structures are provided. It should be understood that steps necessary to illustrate the inventive aspects of the invention are shown, but other processes may be performed before or after the described steps. Throughout the various views and illustrative embodiments of the present invention, like reference numbers are used to designate like elements.

Figure 1:
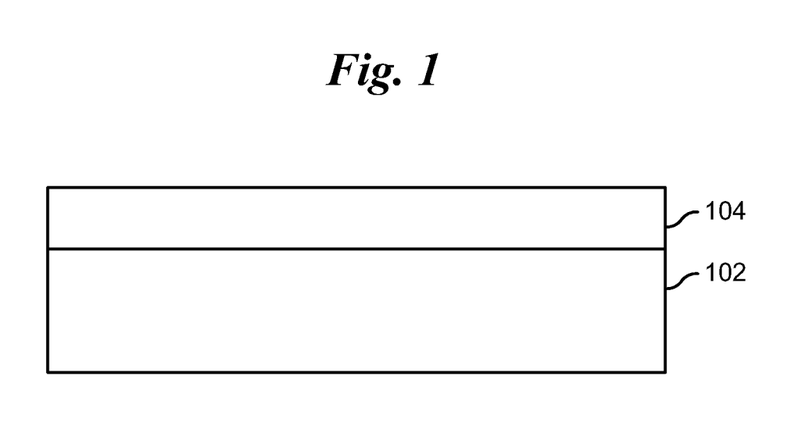
FIGS. 1-6 illustrate various intermediate process steps of manufacturing a light-emitting diode device in accordance with an embodiment of the present invention.

FIGS. 1-6 illustrate various process steps of forming an LED on a conductive substrate in accordance with an embodiment of the present invention. Referring first to FIG. 1, a substrate 102 is shown with a porous layer 104 formed therein. The substrate 102 is preferably a bulk semiconductor substrate, doped or undoped, preferably having a (100) surface orientation. It should be noted that while embodiments of the present invention are described in the context of using a bulk silicon substrate, other substrates may be used. For example, silicon-on-insulator (SOI) substrates, sapphire substrates, SiC substrates, and the like, may also be used. Embodiments of the present invention, however, may be particularly suited to silicon substrates due to the low cost. Furthermore, while a substrate having a (100) surface orientation is preferred, substrates having a different surface orientation, such as (110) or (111) surface orientations, may also be used.

The porous layer 104 is formed by converting a portion of the substrate 102 to a porous layer. In an embodiment in which the substrate 102 is a bulk silicon substrate, the porous layer 104 may be formed by, for example, an electro-chemical anodization process using an electrolyte composition of aqueous solution of hydrofluoric acid (about 20% by mass) and ethylic alcohol with an anodic current density of about 1 mA/cm$^2$ to about 200 mA/cm$^2$. Preferably, the substrate 102 has a thickness, before forming the porous layer 104, of at least about 100 μm and the porous layer 104 has a thickness of about 10 Å to about 1 μm. As will be discussed in greater detail below, the porous layer 104 will act as a separation layer for separating the substrate 102 from an LED structure formed in subsequent processes.

Figure 2:
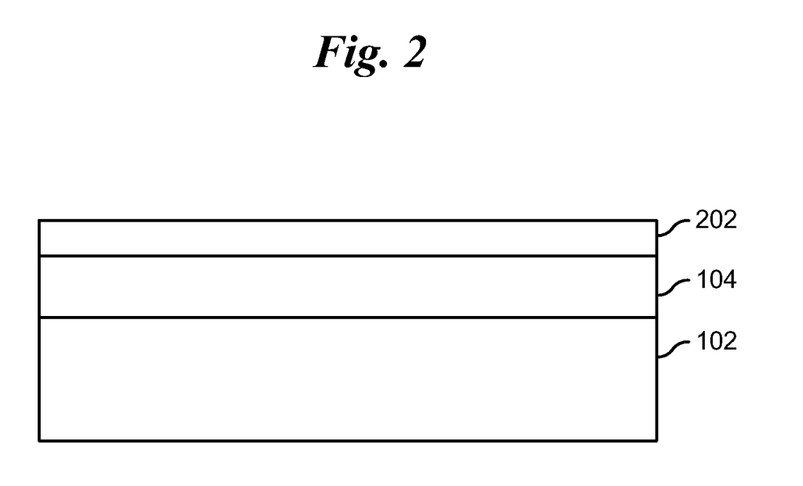

FIG. 2 illustrates an optional step of forming a seed layer 202 over the porous layer 104 in accordance with an embodiment of the present invention. The seed layer 202 may provide a better surface and a seed layer upon which an LED structure may be epitaxially formed in subsequent processing steps. The seed layer 202 is preferably formed using an epitaxial growth of silicon (Si), though other compounds, such as silicon germanium ($Si_xGe_{(1-x)}$), silicon carbon ($Si_xC_{(1-x)}$), or the like, may also be used.

In an embodiment, the etch stop layer 191 may be formed of SiN, SiCN, SiCO, CN, combinations thereof, or the like deposited by chemical vapor deposition (CVD) or plasma-enhanced CVD (PECVD) techniques. In an embodiment, a seed layer 202 of silicon is formed using a chemical vapor deposition (CVD) process using an ambient of $H_2$ at a temperature of about 600° C. to about 1100° C. and a pressure of about 1 torr to about 760 torr. If used, the seed layer 202 preferably has a thickness of about 1 nm to about 1000 nm. Other processes, such as a remote plasma-enhanced chemical vapor deposition (RPCVD), molecular-beam epitaxy (MBE), metal organic vapor phase epitaxy (MOVPE), hydride vapor phase epitaxy (HVPE), liquid phase epitaxy (LPE), or the like, may also be used to deposit the seed layer.

In another embodiment, an SOI substrate is used rather than the substrate 102 with the porous layer 104 and the seed layer 202 formed thereon. In this embodiment, the underlying substrate (which is typically a base silicon layer) may be separated from the overlying silicon layer (also referred to as the active layer) by etching laterally through the insulator layer as discussed below.

Figure 3:
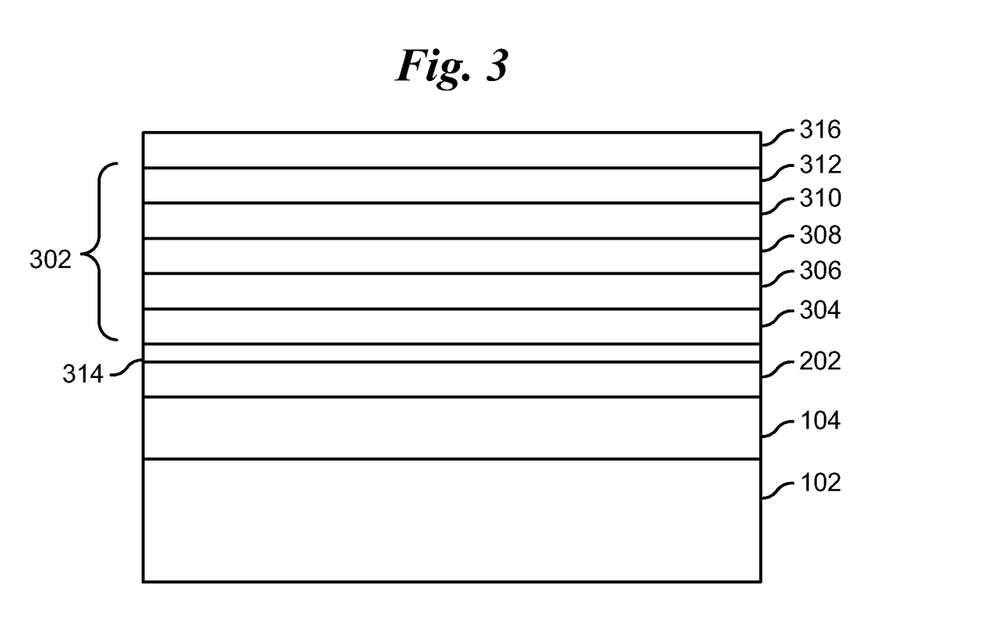

FIG. 3 illustrates forming an LED structure 302 over the substrate 102 in accordance with an embodiment of the present invention. The LED structure 302 may include a first contact layer 304, a first cladding layer 306, an active layer 308, a second cladding layer 310, and a second contact layer 312. An optional buffer layer 314 may also be used.

The buffer layer 314 comprises one or more layers of a material formed over substrate 102 (e.g., the porous layer 104 and/or the seed layer 202) and acts as a nucleation layer during the epitaxy growth process for the formation of the subsequent layers of the LED structure 302. Depending upon the type of substrate and the connections to the first and second contact layers 304 and 312, respectively, a buffer layer may be desirable between the first contact layer 304 and the substrate 102 (or the porous layer 104 or the seed layer 202). For example, with some types of substrates, such as SiC and Si substrates, a buffer layer, such as AlN or AlGaN, may be desirable to aid in the epitaxial growth of a group III-N compound on the SiC substrate.

The buffer layer 314 may be formed of, for example, a group III-N based material, a metal nitride, a metal carbide, a metal carbon-nitride, a pure metal, a metal alloy, silicon-containing material, or the like, formed by, for example, metal organic CVD (MOCVD), MOVPE, plasma-enhanced CVD (PECVD), RPCVD, MBE, HYPE, LPE, chloride VPE (Cl-VPE), or the like. Examples of materials that may be used for the buffer layer 314 include SiC, ZnO, GaN, InN, AlN, InGaN, AlGaN, AlInN, AlInGaN, and the like. The buffer layer 314 may further include a plurality of layers, such as a plurality of AlN layers and a plurality of silicon-doped GaN layers stacked in an alternating pattern. Buffer layer 314 may be doped with a p-type or an n-type impurity, or substantially un-doped.

The first contact layer 304 is formed over the buffer layer 314. The first contact layer 304 may be formed of a group III-nitride (or other group V element). In an embodiment, the first contact layer 304 is formed of a group III-N compound with an n-type conductivity (e.g., n-GaN) and disposed by, for example, a selective epitaxial growth process such as a MBE, MOCVD, HYPE, LPE, or the like. The group III-N material may include, for example, GaN, InN, AlN, $In_xGa_{(1-x)}N$, $Al_xGa_{(1-x)}N$, $Al_xIn_yGa_{(1-x-y)}N$, or the like. Other materials, including other group V elements instead of nitride, may be used.

The optional first cladding layer 306 is formed over the first contact layer 304. Similar to the first contact layer 304, the first cladding layer 306 may be formed of a group III-N compound (or other group V element). In an exemplary embodiment, the first cladding layer 306 comprises a group III-N compound having n-type conductivity (e.g., n-AlGaN). The formation methods of the first cladding layer 306 may be essentially the same as the method for forming first contact layer 304.

The light-emitting layer 308 (also sometimes referred to as an active layer) is formed on the first cladding layer 306. The light-emitting layer 308 may include a homojunction, heterojunction, single-quantum well (SQW), multiple-quantum well (MQW), or the like, structure. In an exemplary embodiment, the light-emitting layer 308 comprises undoped n-type gallium indium nitride ($Ga_xIn_yN_{(1-x-y)}$). In alternative embodiments, light-emitting layer 308 includes other commonly used materials such as $Al_xIn_yGa_{(1-x-y)}N$. In yet other embodiments, light-emitting layer 308 may be a multiple quantum well including multiple well layers (such as InGaN) and barrier layers (such as GaN) allocated in an alternating pattern. Again, the formation methods include MOCVD, MBE, HYPE, LPE, or other applicable CVD methods. The total thickness of the light-emitting layer 308 is preferably between about 5 nm and about 200 nm.

An optional second cladding layer 310 may be formed on light-emitting layer 308. In an embodiment, the second cladding layer 310 comprises a material similar to that of first cladding layer 306, such as AlGaN, except the second cladding layer 310 may be doped to p-type. The formation method of the second cladding layer 310 may be essentially the same as the method for forming the first cladding layer 306, except having an opposite type of conductivity.

The second contact layer 312 is formed on the second cladding layer 310. The second contact layer 312 may be formed of essentially the same or different materials, and using similar methods, as the formation of first contact layer 304, except the conductivity type of the second contact layer 312 is opposite to that of the first contact layer 304.

Also shown in FIG. 3 is an optional reflective layer 316 formed over the top of the group III-V LED stack. The reflective layer 316 acts to reflect light emitted from the light-emitting layer 308 toward and through the second contact layer 312 back toward the first contact layer 304, which will act as the light-emitting face of the LED device as discussed below. The optional reflective layer 316 may comprise a single layer, such as a layer of reflective metal (e.g., Al, Ag, or the like), or a multiple layer structure, such as a distributed Bragg reflector, an omni-directional reflector, or the like. In other embodiments in which the second contact layer 312 is highly reflective, the reflective layer 316 may not be necessary.

Figure 4:
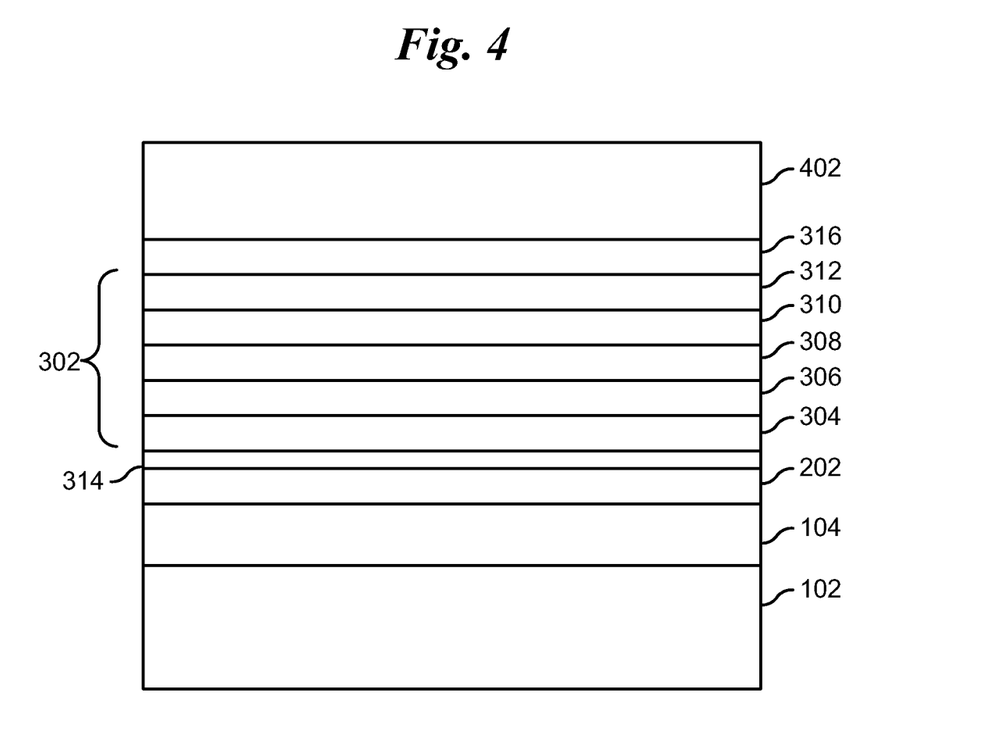

FIG. 4 illustrates forming a conductive substrate 402 on the LED structure 302 in accordance with an embodiment of the present invention. The conductive substrate 402 is formed over the LED structure 302 and provides an electrical contact to the second contact layer 312 (and/or the reflective layer 316). The conductive substrate 402 may be formed of any suitable conductive material, such as doped silicon, metal, metal alloy, or the like. The conductive substrate 402 preferably has a thickness greater than about 50 µm.

In an embodiment, the conductive substrate 402 is formed by electroplating. In this embodiment, the wafer is coated with a seed layer (not shown) and then placed in an electroplating solution containing ions of a metal, such as nickel, chromium, copper, or the like, and a voltage is applied. For example, if nickel is to be utilized for the conductive substrate 402, the wafer is placed in a solution comprising $NiSO_4$, $NiCl_2$, and $H_2O_2$. The wafer surface is electrically connected to the negative side of an external DC power supply such that the wafer functions as the cathode in the electroplating process. A nickel anode is also immersed in the solution and is attached to the positive side of the power supply. The nickel atoms of the anode are oxidized to form $Ni^{2+}$ ions. The $Ni^{2+}$ ions are released from the anode and dissolve into the solution. As the positive nickel ions arrive at the negative-biased cathode, e.g., the wafer, they are reduced to nickel metal that plates the wafer surface.

In another embodiment, the conductive substrate 402 is formed of silicon. In this embodiment, a silicon substrate is bonded to the surface of the second contact layer 312, thereby forming the conductive substrate 402 as illustrated in FIG. 4. The silicon substrate that is bonded is preferably a bulk silicon substrate doped with ions having a conductivity type the same as the second contact layer 312 of the LED structure 302. For example, in an embodiment in which the second contact layer 312 is a p-type conductivity material, the silicon substrate is doped with boron ions or other p-type ions. The silicon substrate may be bonded to the second contact layer 312 through Au—Si eutectic bonding (depositing Au on 312 first) or metal-to-metal bonding (depositing Au or Cu on both substrates).

Figure 5:
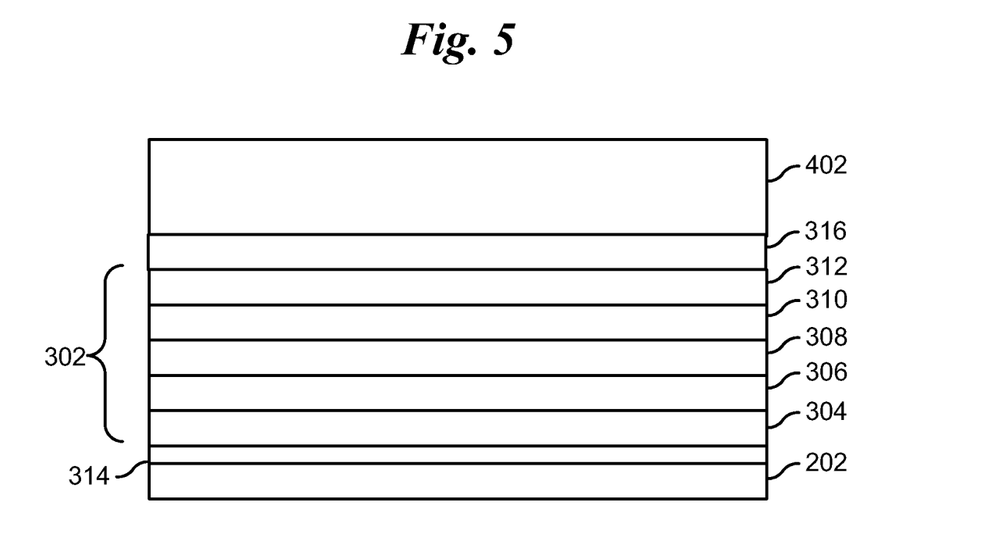

FIG. 5 illustrates removing the substrate 102 and the porous layer 104 in accordance with an embodiment of the present invention. The substrate 102 may be separated from the LED structure 302 by utilizing a mechanical detach process, such as a water jet process. A water jet process utilizes a stream of water to mechanically etch laterally from the edges of the substrate. Because of the porosity of the porous layer 104, the porous layer 104 may be cleaved, thereby separating the substrate 102 from the LED structure 302. The substrate 102 may advantageously be reused, thereby reducing waste and reducing costs.

In another embodiment, the porous layer 104 may be removed by a chemical etch process. In this embodiment, an aqueous solution of 49% hydrofluoric acid: 30% $H_2O_2$ (1:5) may be used to laterally etch the porous layer 104 from the edges of the substrate 102. The hydrofluoric acid has an etch selectivity rate of the porous layer 104 to the substrate 102 (and other layers of the LED structure 302) of about 1-to-100,000. Because of the high etch selectivity rate, a lateral etch is possible without causing substantial damage to the substrate 102 or the LED structure 302. Other splitting methods include: thermal stress, perforation, and inserting a solid wedge.

Figure 6:
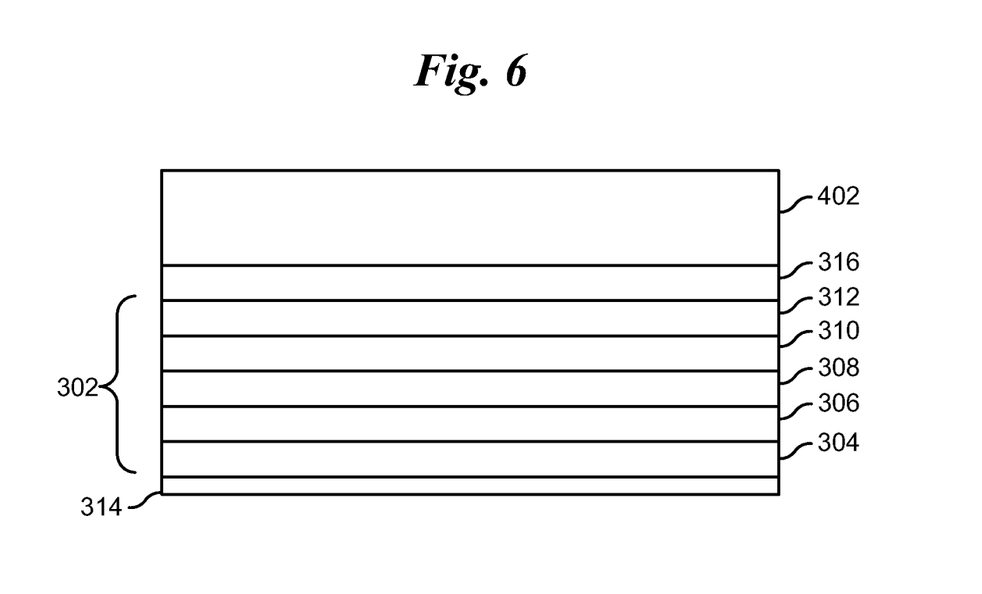

FIG. 6 illustrates removing the seed layer 202 in accordance with an embodiment of the present invention. The seed layer 202 may be removed by, for example, a wet dip in a solution of hydrofluoric acid, nitric acid, and acetic acid (commonly referred to as an HNA solution) or a solution of potassium hydroxide. These solutions will remove any residue of the porous layer 104 as well as remove the seed layer 202. In some embodiments the buffer layer 314 may be removed by wet etching to further improve the electrical contact to the first contact layer 304. As a result, a good electrical contact may be made to the lower portion of the LED structure 302.

Thereafter, processes may be performed to complete the LED device. For example, electrical contacts (front-side and/or back-side contacts) may be formed to the first and second contact layers 304 and 312, respectively, passivation layers may be formed, and the LED device may be diced and packaged.

Similar process could be applied to a somewhat more expensive SOI substrate. Embodiments involving SOI substrates do not require the formation of porous layers because the buried oxide layer in an SOI substrate can be selectively etched. For an embodiment involving an SOI wafer, the substrate in FIG. 2 comprises a silicon substrate 102, a buried oxide layer 104, and a topmost silicon layer 202. Buried oxide layer 104 can be selectively removed by a hydrofluoric-acid solution. For example, immersing the SOI substrate in a hydrofluoric acid solution having about 1-10% by volume of HF will preferentially etch the oxide layer while only slowly etching the topmost silicon layer 202 and the silicon substrate 102. After the buried oxide layer 104 is removed, the subsequent process steps shown in FIGS. 3 through 6 can be carried out as previously described. So, for example, the topmost silicon layer 202 can be removed in the same manner as the previously described seed layer removal process shown in FIG. 6.

Figure 7:
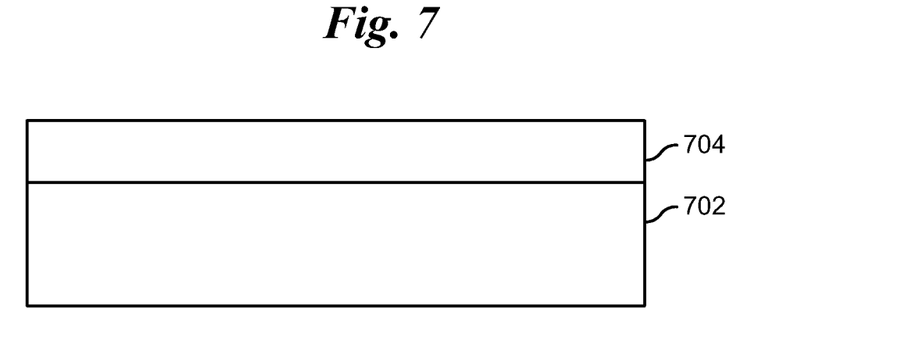
FIGS. 7-12 illustrate various intermediate process steps of manufacturing a light-emitting diode device in accordance with another embodiment of the present invention.

FIGS. 7-11 illustrate another method of forming an LED device in accordance with an embodiment of the present invention. Referring first to FIG. 7, there is shown a substrate 702 having a doped layer 704. The substrate 702 may be of a similar material as the substrate 102 discussed above. The doped layer 704 is preferably formed by implanting p-type ions into the substrate 702. For example, the doped layer 704 may be formed by implanting boron ions at a dose of about $1 \times 10^{13}$ atoms/cm$^2$ to about $1 \times 10^{16}$ atoms/cm$^2$ and at an energy of about 1 KeV to about 50 KeV. A post-implantation thermal anneal may be performed if needed. The doped layer 704 preferably has a thickness of about 0.1 µm to about 10 µm.

The doped layer 704 provides additional structural strength during the fabrication of the LED device as compared to the embodiment discussed above with reference to FIGS. 1-6. A pre-fabricated porous layer 104 (see FIG. 1) is more fragile and in some embodiments may fail to provide sufficient structural support during the fabrication of the LED device. In these embodiments, it is preferred that the doped layer 704 be formed, which will be converted to a porous layer in subsequent processing steps. The use of the doped layer 704 also provides an increased thermal budget tolerance.

Figure 8:
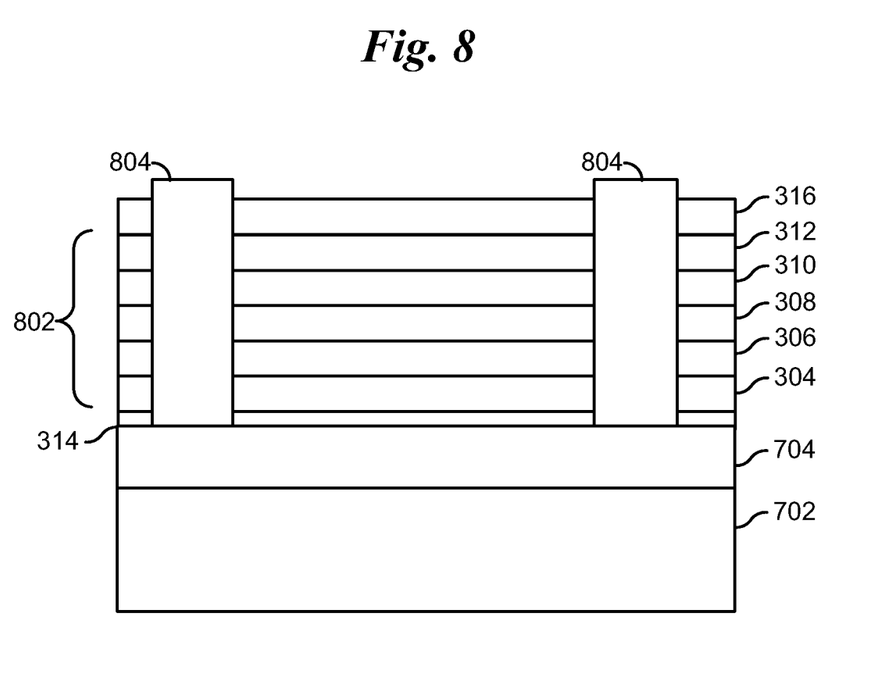

FIG. 8 illustrates a method of forming LED structure 802 in accordance with an embodiment of the present invention. As illustrated in FIG. 8, the LED structure 802 is formed between sacrificial plugs 804. As will be discussed in greater detail below, the sacrificial plugs 804 will be removed in a subsequent step to form a porous layer 1002. Alternatively, some openings 904 are etched through the LED structure to form porous layer 1002.

The sacrificial plugs 804 are preferably formed of a material having a high etch selectivity with respect to the substrate 702. For example, in an embodiment in which the substrate 702 is a silicon substrate, the sacrificial plugs 804 may comprise a silicon dioxide material. In this embodiment, the sacrificial plugs 804 may be formed by depositing and patterning a blanket layer of silicon dioxide. A blanket layer of silicon dioxide may be formed by, for example, thermal oxidation or by chemical vapor deposition (CVD) techniques using tetra-ethyl-ortho-silicate (TEOS) and oxygen as a precursor. Alternatively, the sacrificial plugs 804 may be formed of other dielectric materials. For example, silicon nitride, silicon oxynitride, the like, formed through a process such as CVD may also be used. The sacrificial plugs 804 preferably have a thickness of about 1 μm to about 6 μm.

The blanket layer of silicon dioxide may then be patterned using photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to pattern the sacrificial plugs 804 as illustrated in FIG. 8.

Thereafter, the LED structure 802 may be formed. The LED structure 802 and the buffer layer 314 may have similar layers formed of similar materials as discussed above with reference to the LED structure 302 and the buffer layer 314, wherein like reference numerals refer to like elements.

Figure 9:
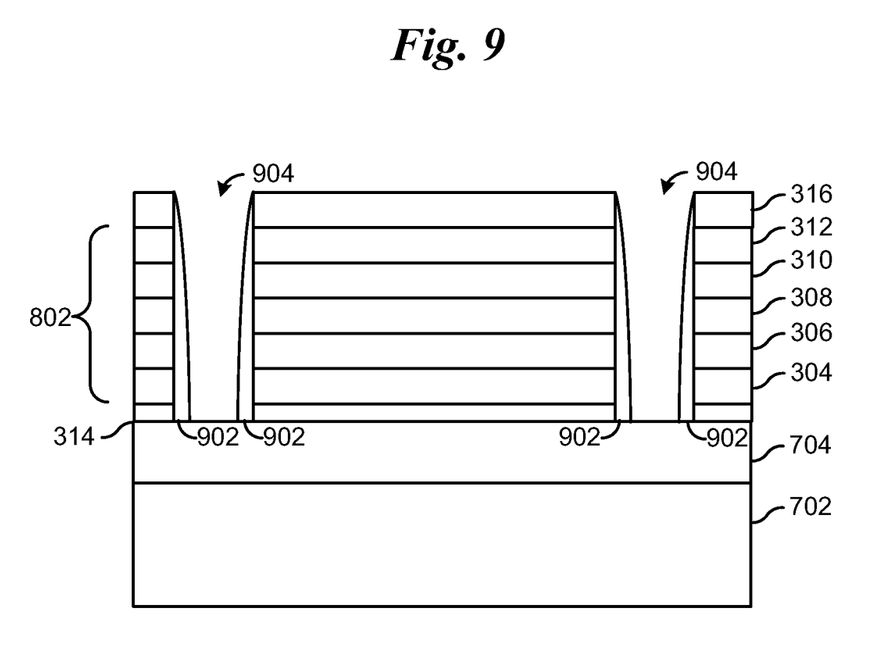

Referring now to FIG. 9, the sacrificial plugs 804 are removed in accordance with an embodiment of the present invention. In an embodiment in which the sacrificial plugs 804 comprise silicon dioxide, the sacrificial plugs 804 may be removed by a wet dip in hydrofluoric acid having a concentration of about 1-10% by volume. The HF etch preferentially etches the sacrificial plugs 804 in that HF only slowly etches the doped layer 704 unless the etch process is enhanced electrochemically.

Also illustrated in FIG. 9 is the formation of spacers 902 along the sidewalls of openings 904. The spacers 902, which should help prevent the upper and lower layers of the LED structure 802 from being shorted, preferably comprise a dielectric material having a high-etch selectivity compared to the LED structure 802 and the doped layer 704. For example, in the embodiment in which the doped layer 704 comprises silicon, the spacers may be formed of a material such as silicon dioxide, silicon nitride ($Si_3N_4$), or another nitrogen-containing layer, such as $Si_xN_y$, silicon oxynitride $SiO_xN_y$, silicon oxime $SiO_xN_y$:$H_z$, or a combination thereof. In a preferred embodiment, the spacers 902 are formed of a blanket layer of silicon nitride formed by, for example, CVD techniques using silane and ammonia as precursor gases as a precursor to a thickness of about 5 nm to about 100 nm. The spacers 902 may be patterned by performing an anisotropic dry etch process.

Figure 10:
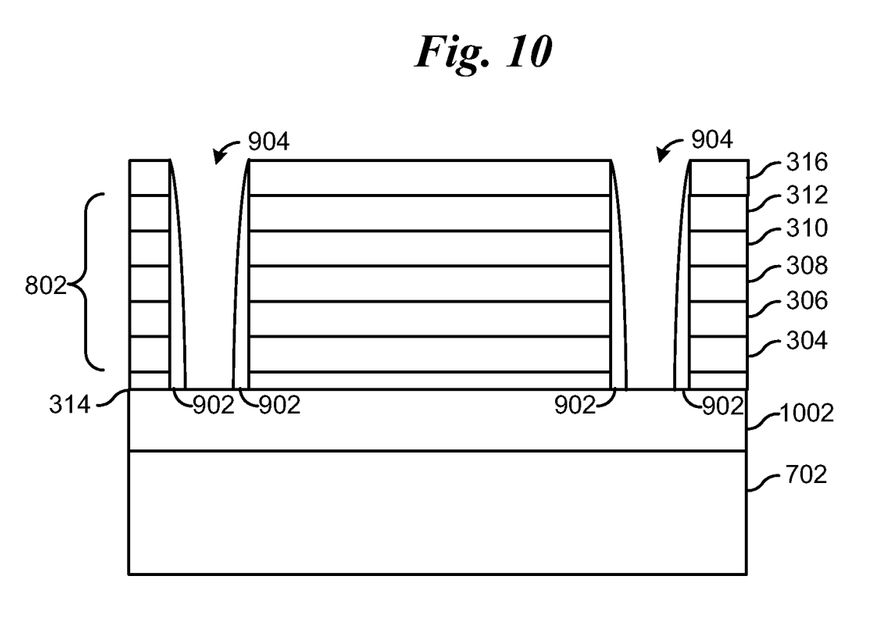

FIG. 10 illustrates the conversion of the doped layer 704 (see FIG. 9) into a porous layer 1002 in accordance with an embodiment of the present invention. The removal of the sacrificial plugs 804 allows the conversion of the doped layer 704 into the porous layer 1002 by a chemical etch process from the opening 904 as well as laterally along the edges of the substrate 702. The doped layer 704 may be converted into the porous layer 1002 by, for example, an electro-chemical anodization process using an electrolyte composition of aqueous solution of hydrofluoric acid (about 20% by mass) and ethylic alcohol with an anodic current density of about 1 $mA/cm^2$ to about 200 $mA/cm^2$. It should be noted that the concentration of the hydrofluoric acid is greater in this step as compared to the etching process used above with reference to FIG. 9 to remove the sacrificial plugs 804, and in this step the etch is also electrochemically enhanced. Using a lower concentration of hydrofluoric acid to remove the sacrificial plugs 804 prevents the hydrofluoric acid from etching or over processing the doped layer 704. It should be noted, however, that over processing the doped layer 704 at this point may cause the substrate 702 to detach prior to forming the conductive substrate as discussed below and, therefore, the concentration of the hydrofluoric acid should be adjusted such that the doped layer 704 is converted to a porous layer without completing removing the doped layer 704, thereby detaching the substrate 702 from the LED structure 802.

Figure 11:
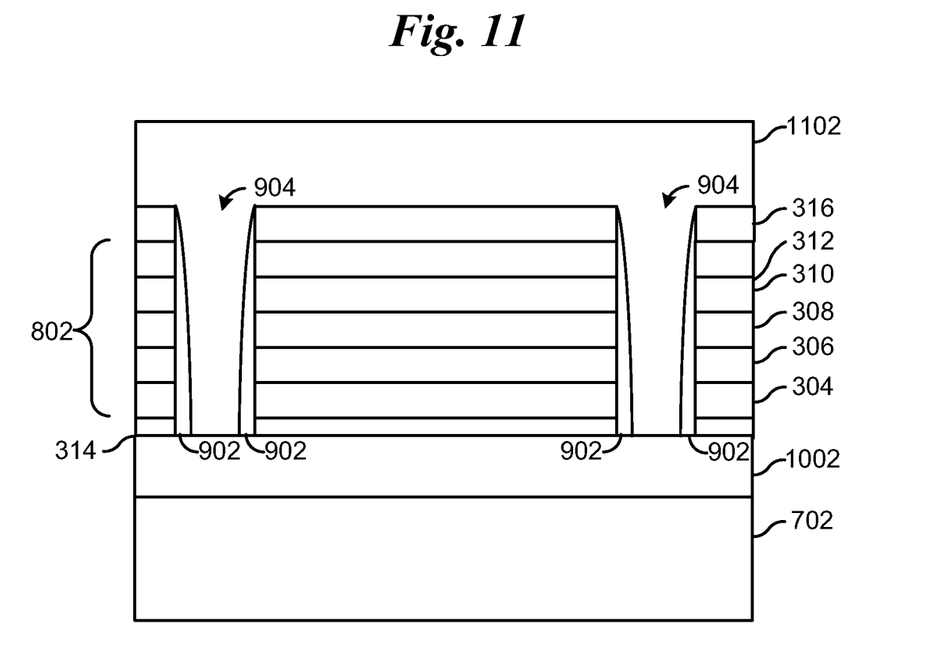

FIG. 11 illustrates forming a conductive substrate 1102 in accordance with an embodiment of the present invention. The conductive substrate 1102 may be formed in a similar manner as the conductive substrate 402 discussed above with reference to FIG. 4, and will not be described again.

Figure 12:
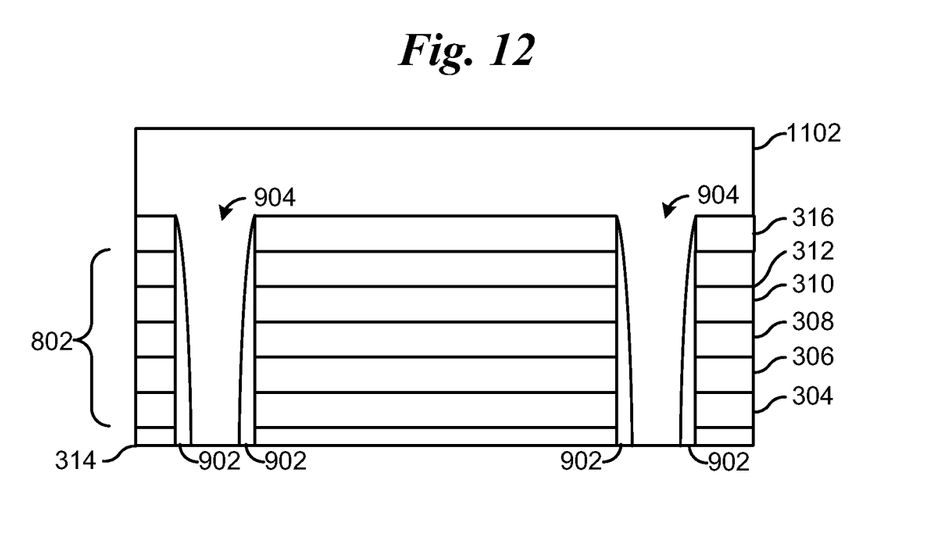

FIG. 12 illustrates removing the substrate 702 and the porous layer 1002 in accordance with an embodiment of the present invention. The substrate 702 and the porous layer 1002 may be removed in a similar manner as the substrate 102 and the porous layer 104 are removed as discussed above with reference to FIG. 5.

It should be noted that the LED structures may be patterned in any suitable pattern with respect to a plan view. For example, the LED structure 802 may be formed in a matrix of squares, rectangles, circles, ellipses, and the like. Furthermore, a plan view may have staggered shapes or be arranged in any number of patterns.

It should be further noted that the LED structures 302 and/or 802 are illustrated as planar devices for illustrative purposes only. In some embodiments, it may be desirable to form the LED structures 302 and/or 802 on a textured substrate. A textured substrate may be formed, for example, by etching recesses and/or forming raised regions via an epitaxial growth. By using a textured surface, the surface area of light-emitting layers may be increased, thereby increasing the light efficiency of the LED device for a given size of a substrate.

While the above description assumes that the LED structure has a p-type surface facing the conductive substrate, one of ordinary skill in the art will appreciate that embodiments of the present invention may utilize an LED structure such that an n-type surface faces the conductive substrate. In these embodiments, the first contact layer 304 and the first cladding layer 306 would have p-type conductivity, and the second cladding layer 310 and the second contact layer 312 would have n-type conductivity.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a light-emitting diode (LED) device, the method comprising:
   providing a first substrate, the substrate having a doped layer;
   forming an LED structure on the first substrate;
   forming a porous layer on the first substrate after forming the LED structure;
   forming a conductive substrate on the LED structure; and
   separating the LED structure from the first substrate along the porous layer.

2. The method of claim 1, wherein the step of separating the LED structure comprises mechanically detaching the first substrate by cleaving the porous layer.

3. The method of claim 1, wherein the step of separating the LED structure comprises removing the porous layer by a chemical etch process.

4. The method of claim 1, further comprising forming a plurality of sacrificial plugs over the substrate before the forming of the LED structure, and wherein the step of forming the LED structure comprises forming the LED structure between the sacrificial plugs.

5. The method of claim 4, further comprising removing the sacrificial plugs to create openings in place of the removed sacrificial plugs.

6. The method of claim 5, further comprising forming spacers along sidewalls of the LED structure.

7. The method of claim 1, wherein the forming the conductive substrate is performed at least in part by electroplating.

8. The method of claim 1, wherein the forming the conductive substrate is performed at least in part by forming a doped silicon layer over the LED structure.

9. The method of claim 1, wherein the first substrate comprises a textured surface.

10. A method, comprising:
    forming a doped layer over a first substrate;
    forming a plurality of sacrificial plugs over the first substrate, wherein the sacrificial plugs and the first substrate have substantially different etching rates to a predetermined etchant;
    forming a light-emitting diode (LED) structure over the doped layer, wherein the LED structure is formed between the sacrificial plugs;
    removing the sacrificial plugs; and
    thereafter converting the doped layer into a porous layer.

11. The method of claim 10, wherein:
    the removing of the sacrificial plugs forms openings in place of the removed sacrificial plugs; and
    the converting of the doped layer is performed at least through the openings.

12. The method of claim 11, wherein the step of converting comprises performing a chemical etch process to the doped layer through the openings.

13. The method of claim 11, further comprising: forming spacers on sidewalls of the LED structure in the openings.

14. The method of claim 10, further comprising:
    forming a second substrate over the LED structure; and
    thereafter removing the porous layer and the first substrate.

15. The method of claim 14, wherein the removing of the porous layer comprises cleaving the porous layer or chemically etching the porous layer.

16. The method of claim 14, wherein:
    the first substrate includes a silicon substrate; and
    the second substrate includes a doped silicon substrate, a metal substrate, or a metal alloy substrate.

17. A method, comprising:
    forming a doped layer over a silicon substrate;
    forming a plurality of dielectric plugs over the silicon substrate;
    forming a light-emitting diode (LED) structure over the doped layer, wherein the LED structure is formed between the dielectric plugs;
    removing the dielectric plugs, thereby forming a plurality of openings that partially expose the doped layer;
    converting the doped layer into a porous layer at least in part by performing an electro-chemical anodization process through the openings;
    forming a conductive substrate over the LED structure; and
    thereafter removing the silicon substrate, wherein the removing of the silicon substrate comprises cleaving the porous layer or chemically etching the porous layer.

18. The method of claim 17, further comprising: forming spacers in the openings.

19. The method of claim 17, wherein the forming of the conductive substrate comprises forming the conductive substrate by electroplating.

20. The method of claim 1, wherein the step of converting the doped layer to the porous layer is performed via an electro-chemical anodization process.

* * * * *